United States Patent
Jung

(10) Patent No.: US 9,219,105 B2
(45) Date of Patent: Dec. 22, 2015

(54) ORGANIC LIGHT EMITTING DIODE DISPLAY

(71) Applicant: SAMSUNG DISPLAY CO., LTD., Yongin, Gyeonggi-Do (KR)

(72) Inventor: Jin Goo Jung, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/456,990

(22) Filed: Aug. 11, 2014

(65) Prior Publication Data
US 2015/0200239 A1     Jul. 16, 2015

(30) Foreign Application Priority Data
Jan. 10, 2014    (KR) .................. 10-2014-0003546

(51) Int. Cl.
*H01L 27/32* (2006.01)
*H01L 51/52* (2006.01)

(52) U.S. Cl.
CPC ........ *H01L 27/3276* (2013.01); *H01L 27/3223* (2013.01); *H01L 27/3262* (2013.01); *H01L 27/3265* (2013.01); *H01L 51/529* (2013.01)

(58) Field of Classification Search
CPC ........... H01L 51/0545; H01L 51/0036; H01L 51/0541; H01L 51/5012; B82Y 10/00
See application file for complete search history.

(56) References Cited

U.S. PATENT DOCUMENTS

| | | | | |
|---|---|---|---|---|
| 2004/0188683 A1* | 9/2004 | Hotta | ............................... | 257/59 |
| 2005/0099369 A1* | 5/2005 | Lee | ................................ | 345/76 |
| 2006/0049407 A1* | 3/2006 | Jung et al. | ....................... | 257/72 |
| 2008/0149811 A1* | 6/2008 | Kim | .............................. | 250/205 |
| 2011/0266545 A1* | 11/2011 | Won et al. | ....................... | 257/59 |
| 2012/0092599 A1* | 4/2012 | Lee et al. | ....................... | 349/106 |
| 2012/0138933 A1* | 6/2012 | Kwon et al. | .................... | 257/59 |
| 2012/0299888 A1* | 11/2012 | Kim et al. | ..................... | 345/205 |

FOREIGN PATENT DOCUMENTS

| | | |
|---|---|---|
| KR | 10-0297868 | 10/2001 |
| KR | 10-0615265 | 8/2006 |
| KR | 10-0712211 | 4/2007 |
| KR | 10-1022559 | 3/2011 |
| KR | 10-2012-0127905 | 11/2012 |
| WO | WO 2013 073611 A1 * 5/2013 .......... H01L 27/3244 |

OTHER PUBLICATIONS

Machine Translation of KR-10-2003-0070241.*

* cited by examiner

*Primary Examiner* — Michelle Mandala
*Assistant Examiner* — Tyler Drye
(74) *Attorney, Agent, or Firm* — Christie, Parker & Hale, LLP

(57) ABSTRACT

An organic light emitting diode display includes: a substrate including a display area configured to display an image and a peripheral area surrounding the display area; a semiconductor layer at the display area on the substrate; a first gate insulating layer covering the semiconductor layer; a first gate wire on the first gate insulating layer; a second gate insulating layer covering the gate wire; a second gate wire on the second gate insulating layer; an interlayer insulating layer covering the second gate wire and having a contact hole, and a plurality of first dummy contact holes; a data wire on the interlayer insulating layer; a passivation layer covering the data wire; and an organic light emitting diode on the passivation layer and coupled to the data wire, wherein the data wire is coupled with the second gate wire through the contact hole in the interlayer insulating layer.

10 Claims, 10 Drawing Sheets

ORGANIC LIGHT EMITTING DIODE DISPLAY

CROSS-REFERENCE TO RELATED APPLICATION

This application claims priority to and the benefit of Korean Patent Application No. 10-2014-0003546 filed in the Korean Intellectual Property Office on Jan. 10, 2014, the entire contents of which are incorporated herein by reference.

BACKGROUND

1. Field

Embodiments of the present invention relate to an organic light emitting diode display.

2. Description of the Related Art

An organic light emitting diode display includes two electrodes and an organic emission layer positioned therebetween, and electrons injected from one electrode and holes injected from the other electrode are coupled with each other in the organic emission layer to generate excitons, and the excitons emit energy to emit light.

Such an organic light emitting diode display includes a plurality of pixels, each of the pixels including an organic light emitting diode which is a self-emission device, a plurality of thin film transistors for driving the organic light emitting diode, and a storage capacitor. The plurality of thin film transistors basically includes a switching thin film transistor and a driving thin film transistor.

When light emitted by the organic light emitting diode is expressed or emitted from black to white according to a driving current Id flowing in the organic light emitting diode, a distance between a gate voltage corresponding to (e.g., expressing) black and a gate voltage corresponding to (e.g., expressing) white is defined as a driving range of the gate voltage. In the organic light emitting diode display, since a size of one pixel may be decreased as the resolution of the display increases, a current amount flowing per pixel may be decreased and thus the driving range of the gate voltage applied to the gate electrode of the driving thin film transistor is narrowed. Accordingly, it is difficult to control a magnitude of a gate voltage Vgs applied to the driving thin film transistor so as to have a sufficient number of rich grays.

The above information disclosed in this Background section is only for enhancement of understanding of the background of embodiments of the present invention and therefore it may contain information that does not form the prior art that is known to a person of ordinary skill in the art.

SUMMARY

Embodiments of the present invention have been described in an effort to provide an organic light emitting diode display having high resolution.

One embodiment of the present invention provides an organic light emitting diode display including: a substrate including a display area configured to display an image and a peripheral area surrounding the display area; a semiconductor layer at the display area on the substrate; a first gate insulating layer covering the semiconductor layer; a first gate wire on the first gate insulating layer; a second gate insulating layer covering the gate wire; a second gate wire on the second gate insulating layer; an interlayer insulating layer covering the second gate wire and having a contact hole, and a plurality of first dummy contact holes; a data wire on the interlayer insulating layer; a passivation layer covering the data wire; and an organic light emitting diode on the passivation layer and coupled to the data wire, wherein the data wire is coupled with the second gate wire through the contact hole in the interlayer insulating layer.

Each of the first dummy contact holes may be between the data wire and the second gate wire.

The first gate wire may include a scan line configured to transfer a scan signal; and the data wire may include a data line and a driving voltage line configured to transfer a data signal and a driving voltage, respectively, and a dummy member to which a separate signal is not transferred.

Each of the first dummy contact holes may include a first sub dummy contact hole and a second sub dummy contact hole; and the first sub dummy contact hole may be between the driving voltage line and the second gate wire, and the second sub dummy contact hole may be between the dummy member and the second gate wire.

The first dummy contact hole may be filled with a same material as that of the data wire.

The organic light emitting diode display may further include: a plurality of second dummy contact holes passing through the interlayer insulating layer, the second gate insulating layer, and the first gate insulating layer.

Each of the second dummy contact holes may be filled with a same material as that of the passivation layer.

The semiconductor layer may include a switching semiconductor layer of a switching thin film transistor coupled with the scan line and the data line, and a driving semiconductor layer of a driving thin film transistor coupled with the switching thin film transistor; and the driving semiconductor layer may be curved on a plane.

The organic light emitting diode display may further include: a storage capacitor including a first storage electrode on the first gate insulating layer and overlapping the driving semiconductor layer, and a second storage electrode on the second gate insulating layer covering the first storage electrode and overlapping the first storage electrode, wherein the second storage electrode is a driving gate electrode of the driving thin film transistor, and the second gate wire includes the second storage electrode.

The organic light emitting diode display may further include: a plurality of peripheral thin film transistors at the peripheral area, wherein the plurality of peripheral thin film transistors includes: a peripheral semiconductor layer on the substrate; a peripheral gate electrode on the first gate insulating layer covering the peripheral semiconductor layer; and a peripheral source electrode and a peripheral drain electrode on the second gate insulating layer and the interlayer insulating layer sequentially covering the peripheral gate electrode, wherein the peripheral source electrode and the peripheral drain electrode are coupled with the peripheral semiconductor layers through peripheral contact holes in the first gate insulating layer, the second gate insulating layer, and the interlayer insulating layer, and a number of the peripheral contact holes in one peripheral thin film transistor of the plurality of peripheral thin film transistors is 2 to 4.

According to example embodiments, the stress of the driving thin film transistor is changed by forming a plurality of dummy contact holes at a display area to express rich grays by increasing a driving range of the driving thin film transistor of the display area and decreasing (e.g., minimizing) the number of peripheral contact holes formed in a peripheral thin film transistor of a peripheral part, thereby increasing (e.g., improving) charge mobility of the peripheral thin film transistor of the peripheral part.

Further, the curved driving semiconductor layer is formed and the driving semiconductor layer may be elongated in a narrow space, thereby enlarging a driving range of the gate voltage applied to the driving gate electrode. Accordingly, a gray of light emitted from the organic light emitting diode (OLED) may be more accurately (e.g., finely) controlled by changing a magnitude of the gate voltage, thereby increasing (e.g., enhancing) resolution of the organic light emitting diode display and increasing (e.g., improving) display quality.

Further, in order to secure an area of the storage capacitor reduced by the driving semiconductor layer having a curved portion, the storage capacitor is formed by overlapping with the driving semiconductor layer, thereby sufficiently securing a storage capacitance even with high resolution.

DETAILED DESCRIPTION

Figure 1:
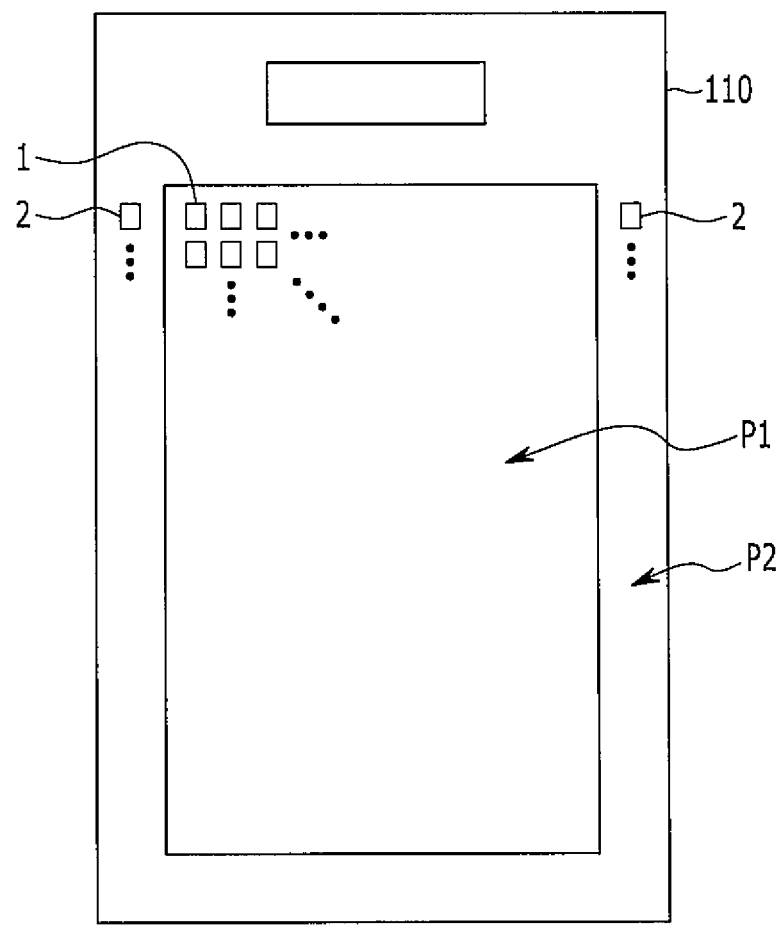
FIG. 1 is a plan view of an organic light emitting diode display according to an example embodiment of the present invention.

The present disclosure will be described more fully hereinafter with reference to the accompanying drawings, in which example embodiments are shown. As those skilled in the art would realize, the described embodiments may be modified in various different ways, all without departing from the spirit or scope of the present disclosure.

The drawings and description are to be regarded as illustrative in nature and not restrictive, and like reference numerals designate like elements throughout the specification.

Further, in the drawings, size and thickness of each element are arbitrarily illustrated for convenience of description, and the present disclosure is not necessarily limited to those illustrated in the drawings.

In the drawings, the thickness of layers, films, panels, regions, etc., are exaggerated for clarity. In the drawings, the thicknesses of a layer and a region are exaggerated for convenience of description. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising", will be understood to imply the inclusion of stated elements but not the exclusion of any other elements. Further, in the specification, the word "on" means positioning on or below the object portion, but does not essentially mean positioning on the upper side of the object portion based on a gravity direction.

Further, in this specification, the word "on a plane" means viewing a target portion from the top, and the word "on a cross section" means viewing a cross section formed by vertically cutting a target portion from the side.

Hereinafter, an organic light emitting diode display according to an example embodiment of the present invention will be described in detail with reference to FIGS. 1 to 8.

FIG. 1 is a plan view of an organic light emitting diode display according to an example embodiment of the present invention.

As illustrated in FIG. 1, an organic light emitting diode display according to an example embodiment includes a display area P1 formed on a substrate 110 and including a plurality of pixels 1, each of the pixels configured with an organic light emitting diode OLED for displaying an image, and a peripheral part (or a peripheral area) P2 surrounding the display area P1 and including a plurality of peripheral circuits 2.

Hereinafter, a pixel formed at the display area P1 of the organic light emitting diode display according to the present example embodiment will be described in detail.

Figure 2:
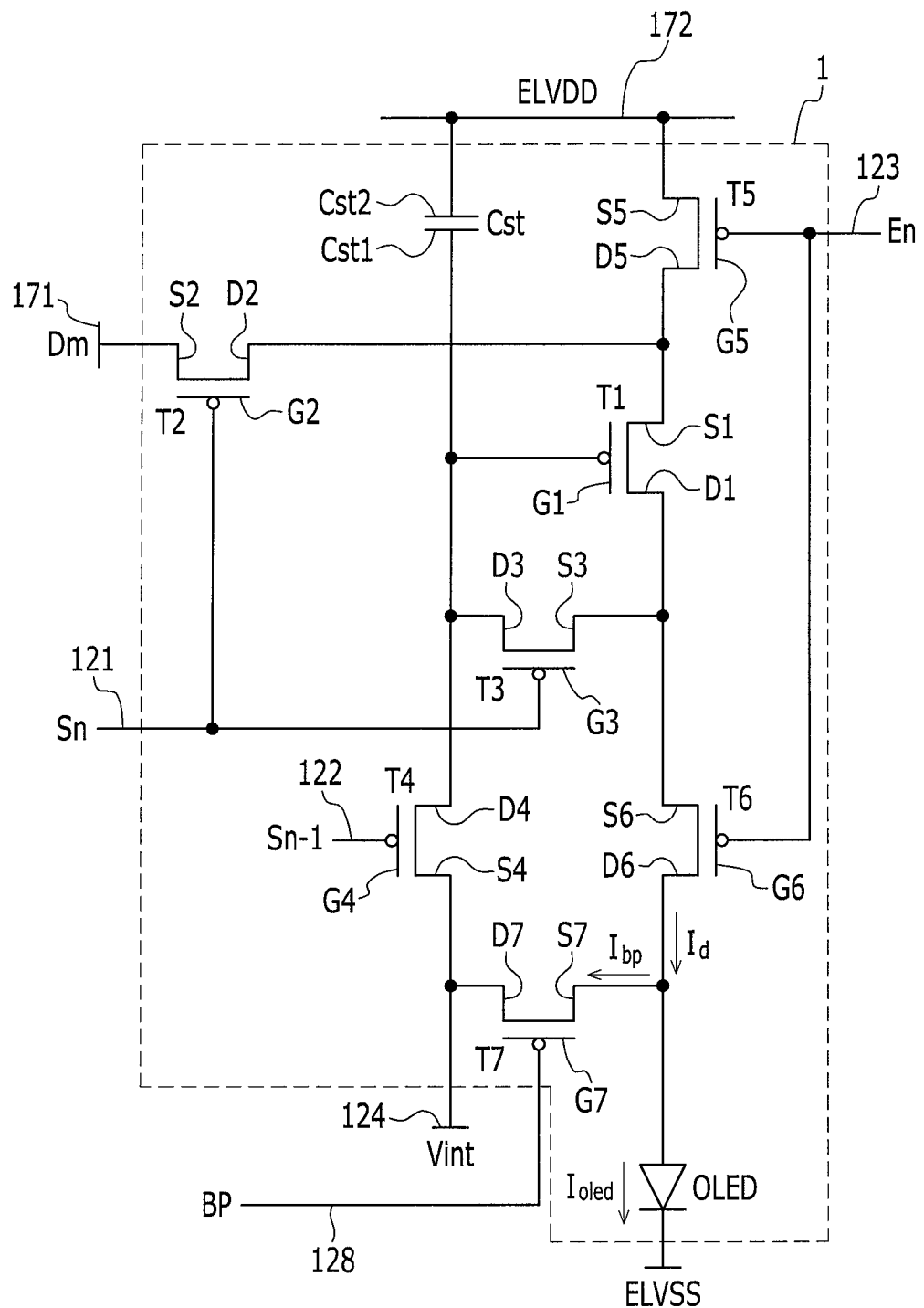
FIG. 2 is an equivalent circuit diagram of one pixel of a display area of the organic light emitting diode display shown in FIG. 1 according to an example embodiment of the present invention.

FIG. 2 is an equivalent circuit diagram of one pixel of a display area of the organic light emitting diode display shown in FIG. 1 according to an example embodiment of the present invention.

As illustrated in FIG. 2, one pixel 1 formed at the display area P1 of the organic light emitting diode display according to the present example embodiment includes a plurality of signal lines 121, 122, 123, 124, 128, 171, and 172, a plurality of thin film transistors T1, T2, T3, T4, T5, T6, and T7 coupled (e.g., connected) to the plurality of signal lines, a storage capacitor Cst, and an organic light emitting diode OLED.

The thin film transistors include a driving thin film transistor T1, a switching thin film transistor T2, a compensation thin film transistor T3, an initialization thin film transistor T4, an operation control thin film transistor T5, an emission control thin film transistor T6, and a bypass thin film transistor T7.

The signal lines include a scan line 121 for transferring a scan signal Sn, a previous scan line 122 for transferring a previous scan signal Sn−1 to the initialization thin film transistor T4, an emission control line 123 for transferring an emission control signal En to the operation control thin film transistor T5 and the emission control thin film transistor T6, an initialization voltage line 124 for transferring an initialization voltage Vint for initializing the driving thin film transistor T1, a bypass control line 128 for transferring a bypass signal BP to the bypass thin film transistor T7, a data line 171 crossing the scan line 121 and for transferring a data signal Dm, and a driving voltage line 172 for transferring a driving voltage ELVDD and formed substantially parallel to the data line 171.

A gate electrode G1 of the driving thin film transistor T1 is coupled (e.g., connected) to one end Cst1 of the storage capacitor Cst, a source electrode S1 of the driving thin film transistor T1 is coupled with the driving voltage line 172 via the operation control thin film transistor T5, and a drain electrode D1 of the driving thin film transistor T1 is electrically coupled with an anode of the organic light emitting diode OLED via the emission control thin film transistor T6. The driving thin film transistor T1 receives the data signal Dm according to a switching operation of the switching thin film transistor T2 to supply a driving current Id to the organic light emitting diode OLED.

A gate electrode G2 of the switching thin film transistor T2 is coupled with the scan line 121, a source electrode S2 of the switching thin film transistor T2 is coupled with the data line 171, and a drain electrode D2 of the switching thin film transistor T2 is coupled with the source electrode S1 of the driving thin film transistor T1 and coupled with the driving voltage line 172 via the operation control thin film transistor T5. The switching thin film transistor T2 is turned on according to the scan signal Sn received through the scan line 121 to perform a switching operation of transferring the data signal Dm transferred to the data line 171 to the source electrode S1 of the driving thin film transistor T1.

A gate electrode G3 of the compensation thin film transistor T3 is directly coupled with the scan line 121, a source electrode S3 of the compensation thin film transistor T3 is coupled to the drain electrode D1 of the driving thin film transistor T1 and coupled with an anode of the organic light emitting diode OLED via the emission control thin film transistor T6, and a drain electrode D3 of the compensation thin film transistor T3 is coupled with one end Cst1 of the storage capacitor Cst and the drain electrode D4 of the initialization thin film transistor T4, and the gate electrode G1 of the driving thin film transistor T1. The compensation thin film transistor T3 is turned on according to the scan signal Sn received through the scan line 121 to couple the gate electrode G1 and the drain electrode D1 of the driving thin film transistor T1 and diode-couple the driving thin film transistor T1.

A gate electrode G4 of the initialization thin film transistor T4 is coupled with a previous scan line 122, a source electrode S4 of the initialization thin film transistor T4 is connected with the initialization voltage line 124, and a drain electrode D4 of the initialization thin film transistor T4 is coupled with one end Cst1 of the storage capacitor Cst, the drain electrode D3 of the compensation thin film transistor T3, and the gate electrode G1 of the driving thin film transistor T1 together. The initialization thin film transistor T4 is turned on according to the previous scan signal Sn−1 received through the previous scan line 122 to transfer the initialization voltage Vint to the gate electrode G1 of the driving thin film transistor T1 and then perform an initialization operation of initializing a voltage of the gate electrode G1 of the driving thin film transistor T1.

A gate electrode G5 of the operation control thin film transistor T5 is coupled with the emission control line 123, a source electrode S5 of the operation control thin film transistor T5 is coupled with the driving voltage line 172, and a drain electrode D5 of the operation control thin film transistor T5 is coupled with the source electrode S1 of the driving thin film transistor T1 and the drain electrode D2 of the switching thin film transistor T2.

A gate electrode G6 of the emission control thin film transistor T6 is coupled with the emission control line 123, a source electrode S6 of the emission control thin film transistor T6 is coupled with the drain electrode D1 of the driving thin film transistor T1 and the source electrode S3 of the compensation thin film transistor T3, and a drain electrode D6 of the emission control thin film transistor T6 is electrically coupled with an anode of the organic light emitting diode OLED. The operation control thin film transistor T5 and the emission control thin film transistor T6 are concurrently (e.g., simultaneously) turned on according to the emission control signal En received through the emission control line 123, and the driving voltage ELVDD is transferred to the organic light emitting diode OLED and thus an emission current Ioled flows in the organic light emitting diode OLED.

A gate electrode G7 of the bypass thin film transistor T7 is coupled to a bypass control line 128, a source electrode S7 of the bypass thin film transistor T7 is coupled with the drain electrode D6 of the emission control transistor T6 and an anode of the organic light emitting diode OLED, and a drain electrode D7 of the bypass thin film transistor T7 is coupled with the initialization voltage line 124 and the source electrode S4 of the initialization thin film transistor T4.

The other end Cst2 of the storage capacitor Cst is coupled with the driving voltage line 172, and a cathode of the organic light emitting diode OLED is coupled with a common voltage ELVSS. As a result, the organic light emitting diode OLED receives the emission current Ioled from the driving thin film transistor T1 to emit light, thereby displaying an image.

Hereinafter, a detailed operation process of one pixel of the organic light emitting diode display according to the present example embodiment will be described in detail.

First, for an initializing period, the previous scan signal Sn−1 having a low level is supplied through the previous scan line 122. Then, the initialization thin film transistor T4 is turned on in response to the previous scan signal Sn−1 having the low level, and the initialization voltage Vint is coupled to the gate electrode G1 of the driving thin film transistor T1 through the initialization thin film transistor T4 from the initialization voltage line 124, and the driving thin film transistor T1 is initialized with the initialization voltage Vint.

Thereafter, for a data programming period, the scan signal Sn having the low level is supplied through the scan line 121. Then, the switching thin film transistor T2 and the compensation thin film transistor T3 are turned on in response to the scan signal Sn having the low level.

In this case, the driving thin film transistor T1 is diode-coupled by the turned-on compensation thin film transistor T3 and biased in a forward direction.

Then, a compensation voltage Dm+Vth (Vth is a negative (−) value) reduced by a threshold voltage Vth of the driving thin film transistor T1 from a data signal Dm supplied from the data line 171 is applied to the gate electrode G1 of the driving thin film transistor T1.

The driving voltage ELVDD and the compensation voltage Dm+Vth are applied to both ends of the storage capacitor Cst, and a charge corresponding to a voltage difference between both ends is stored in the storage capacitor Cst. Thereafter, for an emission period, the emission control signal En supplied from the emission control line 123 is changed from the high level to the low level. Then, the operation control thin film transistor T5 and the emission control thin film transistor T6 are turned on by the emission control signal En of the low level for the emission period.

Then, a driving current Id is generated according to a voltage difference between the voltage of the gate electrode G1 of the driving thin film transistor T1 and the driving voltage ELVDD, and the driving current Id is supplied to the organic light emitting diode OLED through the emission control thin film transistor T6. The gate-source voltage Vgs of the driving thin film transistor T1 is maintained as '(Dm+Vth)−ELVDD' (e.g., the voltage difference between the compensation voltage Dm+Vth and the driving voltage ELVDD) by the storage capacitor Cst for the emission period, and according to a current-voltage relationship of the driving thin film transistor T1, the driving current Id is proportional to the square of a value obtained by subtracting the threshold voltage from the source-gate voltage '$(Dm-ELVDD)^2$'. Accordingly, the driving current Id is determined regardless of the threshold voltage Vth of the driving thin film transistor T1.

In this case, the bypass thin film transistor T7 receives a bypass signal BP from the bypass control line 128. The bypass signal BP is a voltage having a level (e.g., a predetermined level) that turns off the bypass thin film transistor T7, the bypass thin film transistor T7 receives a voltage having a transistor off level from the gate electrode G7, and thus the bypass transistor T7 is turned off, and a part of the driving current Id flows out through the bypass thin film transistor T7 as a bypass current Ibp in the off state.

Accordingly, when the driving current for displaying a black image flows, the emission current Ioled of the organic light emitting diode which is reduced by the current amount of the bypass current Ibp which flows out from the driving current Id through the bypass thin film transistor T7 has a decreased (e.g., a minimum) current amount at a level which may accurately (e.g., exactly) express the black image. Therefore, a black luminance image is accurately (e.g., exactly) implemented by using the bypass thin film transistor T7, thereby improving a contrast ratio.

Next, a detailed structure of the pixel of the display area of the organic light emitting diode display illustrated in FIG. 2 will be described in detail with reference to FIGS. 3 to 7 in addition to FIG. 2.

Figure 3:
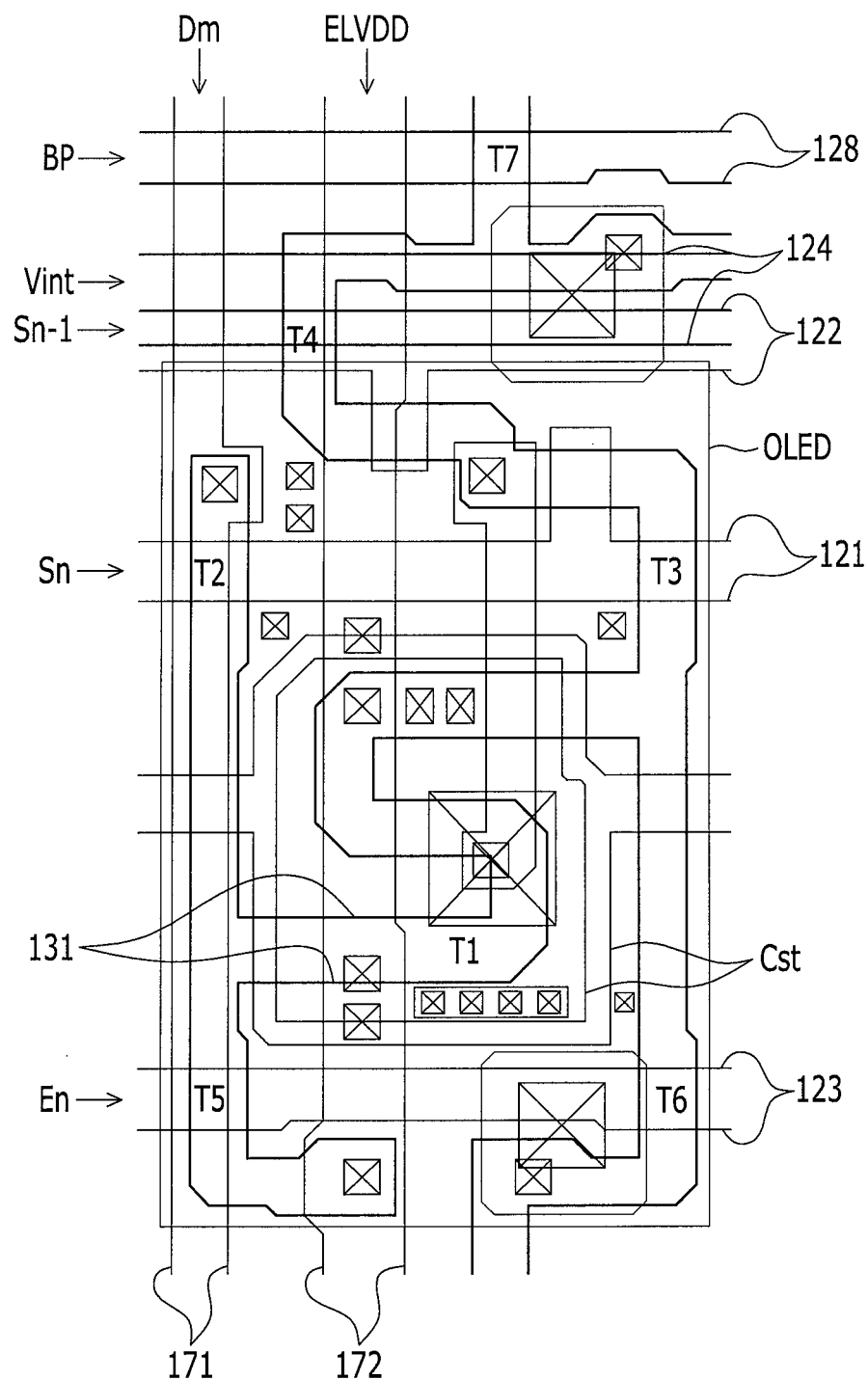
FIG. 3 is a diagram schematically illustrating a plurality of thin film transistors and capacitors of the display area of the organic light emitting diode display shown in FIG. 2 according to an example embodiment of the present invention.
Figure 4:
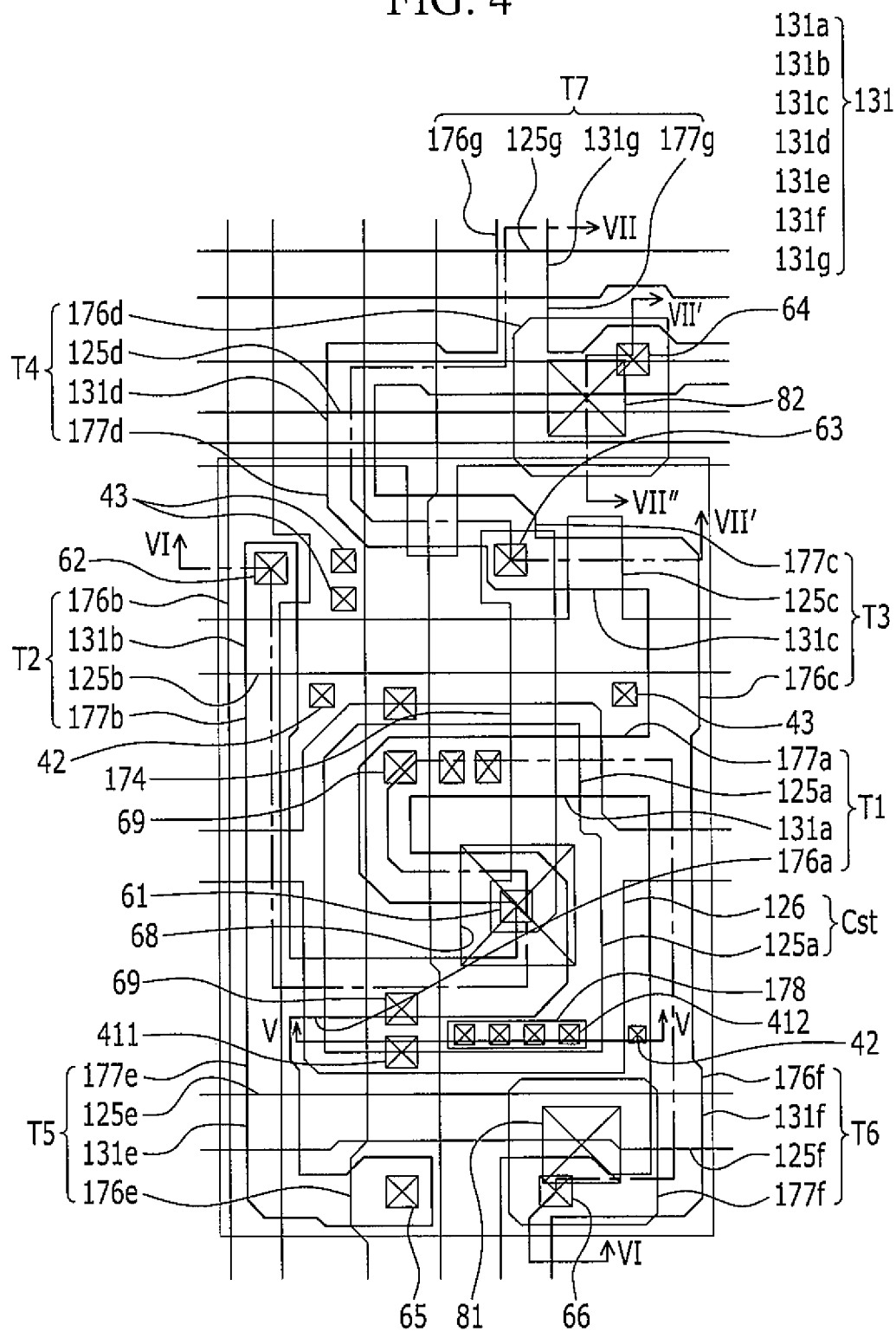
FIG. 4 is a detailed layout view of a pixel shown in FIG. 3.
Figure 5:
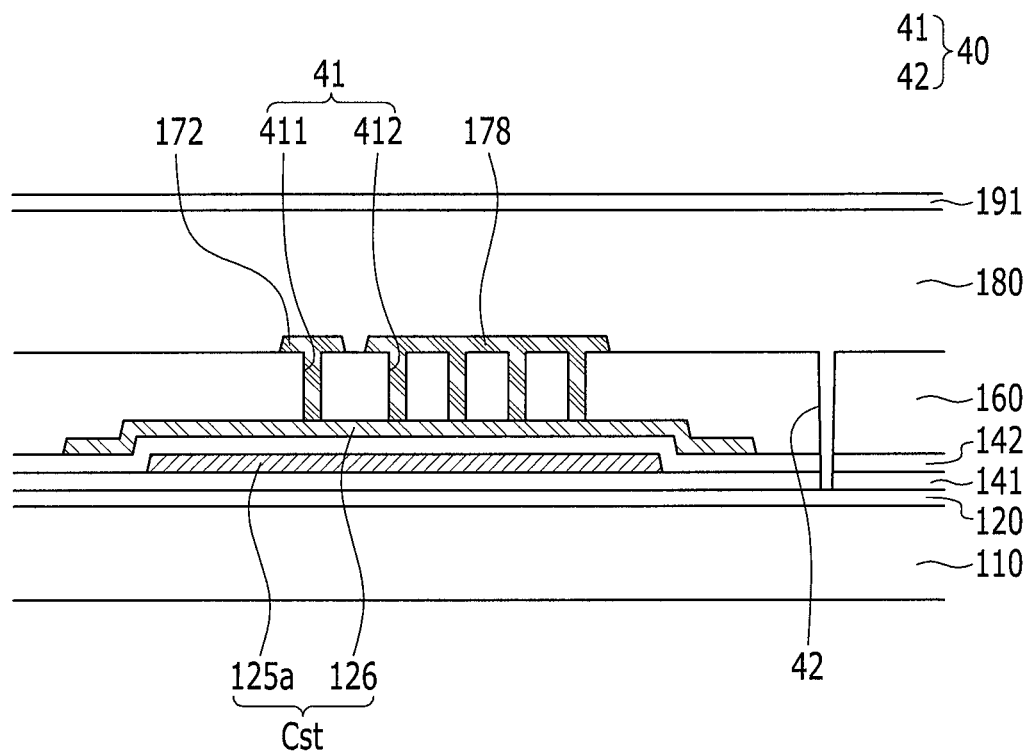
FIG. 5 is a cross-sectional view of the organic light emitting diode display shown in FIG. 4 taken along the line V-V.
Figure 6:
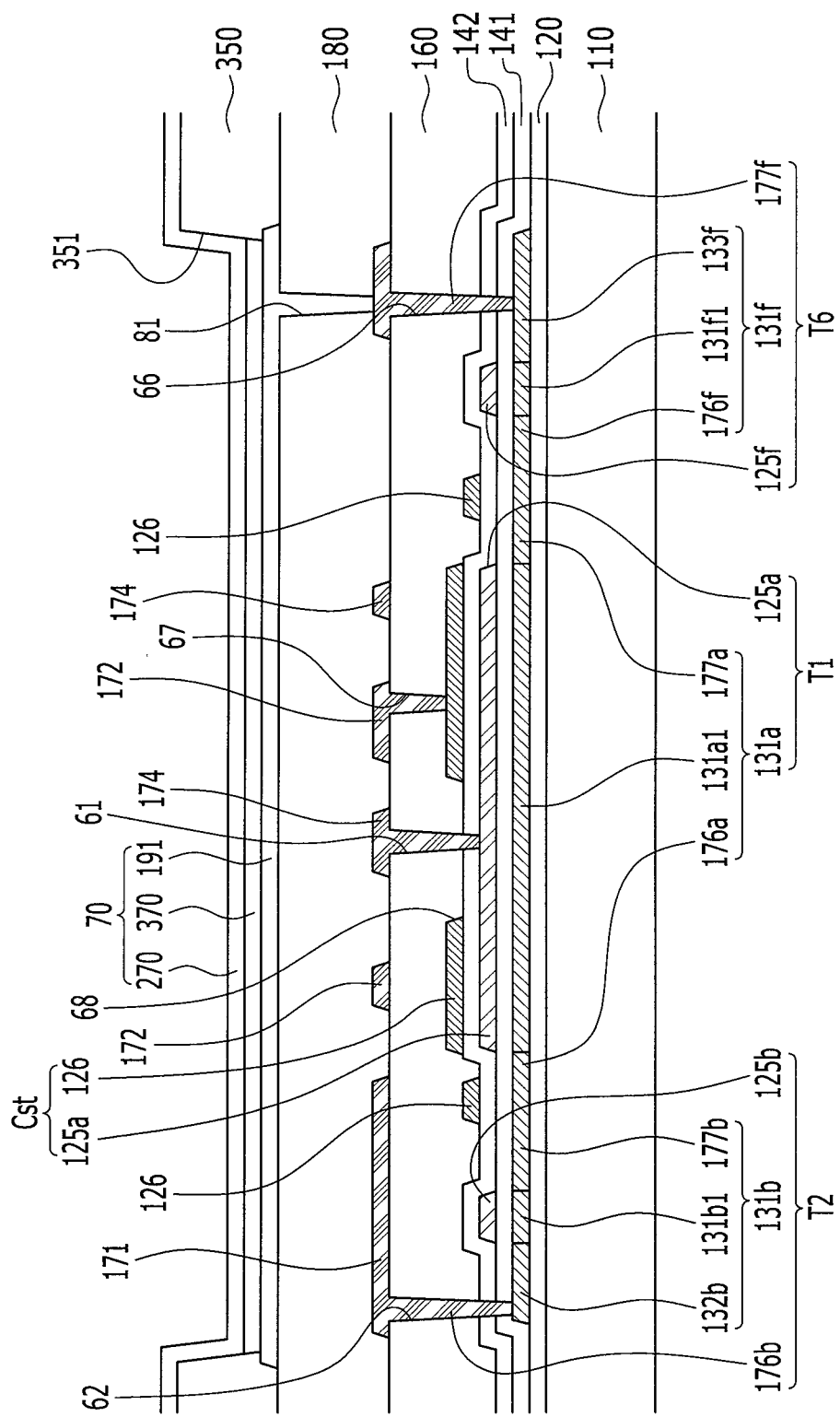
FIG. 6 is a cross-sectional view of the organic light emitting diode display shown in FIG. 4 taken along the line VI-VI.
Figure 7:
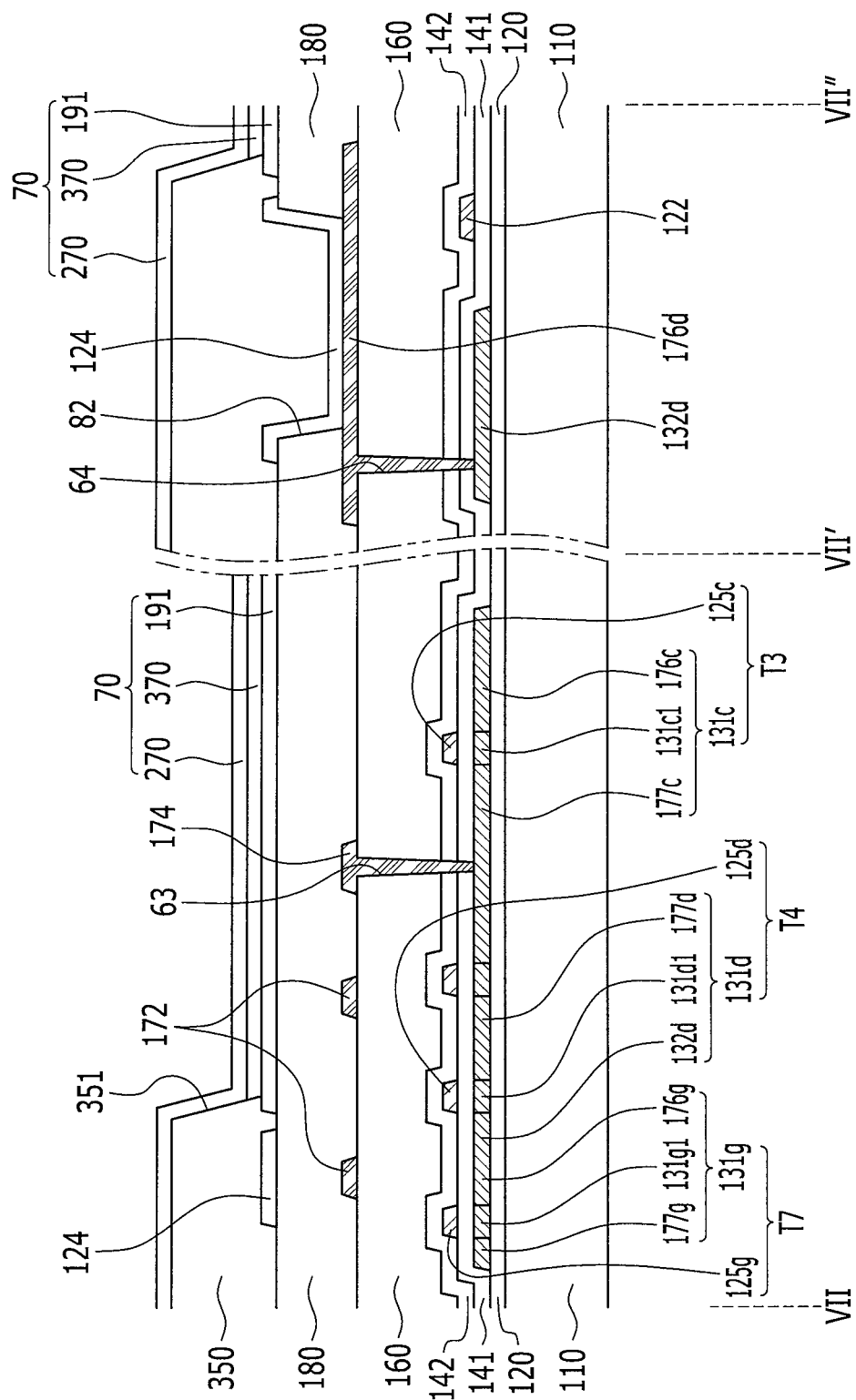
FIG. 7 is a cross-sectional view of the organic light emitting diode display shown in FIG. 4 taken along the lines VII-VII' and VII'-VII".

FIG. 3 is a diagram schematically illustrating a plurality of transistors and capacitors of the display area of the organic light emitting diode display shown in FIG. 2 according to an example embodiment of the present invention, FIG. 4 is a detailed layout view of a pixel shown in FIG. 3, FIG. 5 is a cross-sectional view of the organic light emitting diode display shown in FIG. 4 taken along the line V-V, FIG. 6 is a cross-sectional view of the organic light emitting diode display shown in FIG. 4 taken along line the VI-VI, and FIG. 7 is a cross-sectional view of the organic light emitting diode display shown in FIG. 4 taken along the lines VII-VII' and VII'-VII".

As illustrated in FIG. 3, in the organic light emitting diode display according to the present example embodiment, a pixel of the display area P1 includes a scan line 121, a previous scan line 122, an emission control line 123, and a bypass control line 128 which apply a scan signal Sn, a previous scan signal Sn−1, an emission control signal En, and a bypass signal BP, respectively, and are formed in a row direction. The pixel further includes a data line 171 and a driving voltage line 172, which cross the scan line 121, the previous scan line 122, the emission control line 123, and the bypass control line 128, and apply a data signal Dm and a driving voltage ELVDD to the pixel, respectively. The initialization voltage Vint is transferred to the driving thin film transistor T1 via the initialization thin film transistor T4 from the organic light emitting diode OLED through the initialization voltage line 124.

Further, a driving thin film transistor T1, a switching thin film transistor T2, a compensation thin film transistor T3, an initialization thin film transistor T4, an operation control thin film transistor T5, an emission control thin film transistor T6, a bypass thin film transistor T7, a storage capacitor Cst, and an organic light emitting diode OLED are formed in the pixel.

The driving thin film transistor T1, the switching thin film transistor T2, the compensation thin film transistor T3, the initialization thin film transistor T4, the operation control thin film transistor T5, the emission control thin film transistor T6, and the bypass thin film transistor T7 are formed on or along a semiconductor layer 131, and the semiconductor layer 131 is curved in various shapes (e.g., the semiconductor layer 131 is bent at various locations and angles to form a winding shape). The semiconductor layer 131 may be made of poly-silicon or oxide semiconductor. The oxide semiconductor may include an oxide based on titanium (Ti), hafnium (Hf), zirconium (Zr), aluminum (Al), tantalum (Ta), germanium (Ge), zinc (Zn), gallium (Ga), tin (Sn) or indium (In), zinc oxide (ZnO), indium-gallium-zinc oxide (InGaZnO$_4$), indium zinc oxide (Zn—In—O), zinc-tin oxide (Zn—Sn—O), indium gallium oxide (In—Ga—O), indium-tin oxide (In—Sn—O), indium-zirconium oxide (In—Zr—O), indium-zirconium-zinc oxide (In—Zr—Zn—O) indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum, gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium gallium oxide (In—Ge—Ga—O), titanium-indium-zinc oxide (Ti—In—Zn—O), and/or hafnium-indium-zinc oxide (Hf—In—Zn—O) which are a complex oxide thereof. In the case where the semiconductor layer 131 is made of the oxide semiconductor, in order to protect the oxide semiconductor vulnerable to an external environment such as a high temperature, a separate passivation layer may be added.

The semiconductor layer 131 includes a channel region in which a channel is doped with N-type impurity or P-type impurity, and a source region and a drain region which are formed at both sides of the channel region and formed by doping the doping impurity which is an opposite type to the doping impurity doped in the channel region.

Hereinafter, a detailed planar structure of the organic light emitting diode display according to the present example embodiment will be first described in detail with reference to FIGS. 3 and 4, and a detailed cross-sectional structure will be described in detail with reference to FIGS. 5 to 7.

First, as illustrated in FIGS. 3 and 4, the pixel 1 of the pixel part P1 of the organic light emitting diode display according to the present example embodiment includes the driving thin film transistor T1, the switching thin film transistor T2, the compensation thin film transistor T3, the initialization thin film transistor T4, the operation control thin film transistor T5, the emission control thin film transistor T6, the bypass thin film transistor T7, the storage capacitor Cst, and the organic light emitting diode OLED. The transistors T1, T2, T3, T4, T5, T6, and T7 are formed along the semiconductor layer 131, and the semiconductor layer 131 includes a driving semiconductor layer 131a formed at the driving thin film transistor T1, a switching semiconductor layer 131b formed at the switching thin film transistor T2, a compensation semiconductor layer 131c formed at the compensation thin film transistor T3, an initialization semiconductor layer 131d formed at the initialization thin film transistor T4, an operation control semiconductor layer 131e formed at the operation control thin film transistor T5, an emission control semiconductor layer 131f formed at the emission control thin film transistor T6, and a bypass semiconductor layer 131g formed at the bypass thin film transistor T7.

The driving thin film transistor T1 includes a driving semiconductor layer 131a, a driving gate electrode 125a, a driving source electrode 176a, and a driving drain electrode 177a.

The driving semiconductor layer 131a is curved and may have an oblique shape or a zigzag shape. As such, the curved driving semiconductor layer 131a is formed, and thus the driving semiconductor layer 131a may be elongated in a narrow space. Accordingly, since a driving channel region 131a1 of the driving semiconductor layer 131a may be elongated, a driving range of the gate voltage applied to the driving gate electrode 125a is increased. Accordingly, since the driving range of a gate voltage is increased, a gray light emitted from the organic light emitting diode OLED may be more finely controlled by changing a magnitude of the gate voltage, thereby increasing (e.g., enhancing) resolution of the organic light emitting diode display and increasing (e.g., improving) display quality. The shape of such a driving semiconductor layer 131a may be variously modified, and thus various example embodiments of the present invention, such as 'reverse S', 'S', 'M', 'W', and the like, are possible.

The driving source electrode 176a corresponds to the driving source region 176a which is doped with the impurity at the driving semiconductor layer 131a, and the driving drain electrode 177a corresponds to the driving drain region 177a which is doped with the impurity at the driving semiconductor layer 131a. The driving gate electrode 125a overlaps with the driving semiconductor layer 131a, and the driving gate electrode 125a is formed at the same layer and with the same material as those of the scan line 121, the previous scan line 122, the emission control line 123, the switching gate electrode 125b, the compensation gate electrode 125c, the initialization gate electrode 125d, the operation control gate electrode 125e, and the emission control gate electrode 125f.

The switching thin film transistor T2 includes a switching semiconductor layer 131b, a switching gate electrode 125b, a switching source electrode 176b, and a switching drain electrode 177b. The switching gate electrode 125b is a part of the scan line 121.

The switching source electrode 176b, which is a part of the data line 171, is coupled with the switching source region 132b which is doped with an impurity in the switching semiconductor layer 131b through a contact hole 62, and the switching drain electrode 177b corresponds to the switching drain region 177b, which is doped with the impurity in the switching semiconductor layer 131b.

The compensation thin film transistor T3 includes a compensation semiconductor layer 131c, a compensation gate electrode 125c, a compensation source electrode 176c, and a compensation drain electrode 177c. The compensation source electrode 176c corresponds to the compensation source region 176c doped with impurity in the compensation semiconductor layer 131c, and the compensation drain electrode 177c corresponds to the compensation drain region 177c doped with impurity.

The initialization thin film transistor T4 includes an initialization semiconductor layer 131d, an initialization gate electrode 125d, an initialization source electrode 176d, and an initialization drain electrode 177d. The initialization drain electrode 177d corresponds to the initialization drain electrode 177d in which an impurity is doped.

The initialization source region 132d of the initialization semiconductor layer 131d is coupled with the initialization source electrode 176d having a quadrangular shape through a contact hole 64, and the initialization source electrode 176d is coupled with the initialization voltage line 124 through a contact hole 82. The initialization voltage electrode 124 may be formed on the same layer with the same material as those of the pixel electrode 191.

The operation control thin film transistor T5 includes an operation control semiconductor layer 131e, an operation control gate electrode 125e, an operation control source electrode 176e, and an operation control drain electrode 177e. The operation control source electrode 176e which is a part of the driving voltage line 172 is coupled with the operation control semiconductor layer 131e through a contact hole 65, and the operation control drain electrode 177e corresponds to the operation control drain region 177e doped with impurity in the operation control semiconductor layer 131e.

The emission control thin film transistor T6 includes an emission control semiconductor layer 131f, an emission control gate electrode 125f, an emission control source electrode 176f, and an emission control drain electrode 177f. The emission control source electrode 176f corresponds to an emission control source region 176f doped with the impurity in the emission control semiconductor layer 131f, and the emission control drain electrode 177f having a quadrangular shape is coupled to an emission control drain region 133f doped with the impurity in the emission control semiconductor layer 131f through a contact hole 66.

The bypass thin film transistor T7 includes a bypass semiconductor layer 131g, a bypass gate electrode 125g, a bypass source electrode 176g, and a bypass drain electrode 177g. The bypass source electrode 176g corresponds to the bypass source region 176g doped with impurity in the bypass semiconductor layer 131g, and the bypass drain electrode 177g corresponds to the bypass drain region 177g doped with impurity in the bypass semiconductor layer 131g. The bypass source electrode 176g is directly coupled with the emission control drain region 133f.

One end of the driving semiconductor layer 131a of the driving thin film transistor T1 is coupled with the switching semiconductor layer 131b and the operation control semiconductor layer 131e, and the other end of the driving semiconductor layer 131a is coupled with the compensation semiconductor layer 131c and the emission control semiconductor layer 131f. Accordingly, the driving source electrode 176a is coupled with the switching drain electrode 177b and the operation control drain electrode 177e, and the driving drain electrode 177a is coupled with the compensation source electrode 176c and the emission control source electrode 176f.

The storage capacitor Cst includes a first storage electrode 125a and a second storage electrode 126 with a second gate insulating layer 142 therebetween. The first storage electrode 125a is the driving gate electrode 125a, the third gate insulating layer 143 is a dielectric material, and a storage capacitance is determined by a charge charged in the storage capacitor Cst and a voltage between the two storage electrodes 125a and 126.

A connecting member (or coupling member) 174 is formed on the same layer as that of the data line 171 in parallel to the data line 171, and couples the driving gate electrode 125a and the compensation drain electrode 177c of the compensation thin film transistor T3. The first storage electrode 125a which is the driving gate electrode 125a is coupled with the connecting member 174 through a contact hole 61, and the compensation drain electrode 177c is coupled with the connecting member 174 through a contact hole 63 in the compensation semiconductor layer 131c.

Accordingly, the storage capacitor Cst stores a storage capacitance corresponding to a difference between the driving voltage ELVDD transferred to the second storage electrode 126 through the driving voltage line 172 and the gate voltage of the driving gate electrode 125a.

As such, in order to provide (e.g., secure) an area of the storage capacitor reduced by the driving semiconductor layer having a curved portion, the storage capacitor is formed by overlapping with the driving semiconductor layer, thereby sufficiently providing (e.g., securing) a storage capacitance even at high resolution.

The switching thin film transistor T2 is used as a switching element for selecting the pixel to emit light. The switching gate electrode 125b is coupled to the scan line 121, the switching source electrode 176b is coupled to the data line 171, and the switching drain electrode 177b is coupled with the driving thin film transistor T1 and the operation control thin film transistor T5. In addition, the emission control drain electrode 177f of the emission control thin film transistor T6 is directly coupled with a pixel electrode 191 of an organic light emitting diode 70.

Hereinafter, a structure of the organic light emitting diode display according to the present example embodiment will be described in detail in the order of laminating with reference to FIGS. 5 to 7.

In this case, since the operation control thin film transistor T5 is almost the same as a laminating structure of the emission control thin film transistor T6, a detailed description is omitted.

A buffer layer 120 is formed on a substrate 110, and an insulation substrate made of glass, quartz, ceramic, plastic, or the like may be formed as the substrate 110.

A semiconductor layer 131 including a driving semiconductor layer 131a, a switching semiconductor layer 131b, a compensation semiconductor layer 131c, an initialization semiconductor layer 131d, an operation control semiconductor layer 131e, an emission control semiconductor layer 131f, and a bypass semiconductor layer 131g is formed on the buffer layer 120.

The driving semiconductor layer 131a includes a driving source region 176a and a driving drain region 177a which face each other with a driving channel region 131a1 therebetween, and the switching semiconductor layer 131b includes a switching source region 132b and a switching drain region 177b which face each other with a switching channel region 131b1 therebetween. In addition, the compensation semiconductor layer 131c includes a compensation channel region 131c1, a compensation source region 176c, and a compensation drain region 177c, and the initialization semiconductor layer 131d includes an initialization channel region 131d1, an initialization source region 132d, and an initialization drain region 177d, and the emission control semiconductor layer 131f includes an emission control channel region 131f1, an emission control source region 176f, and an emission control drain region 133f, and the bypass semiconductor layer 131g includes a bypass channel region 131g1, a bypass source region 176g, and a bypass drain region 177g.

A first gate insulating layer 141 is formed on the driving semiconductor layer 131a, the switching semiconductor layer 131b, the compensation semiconductor layer 131c, the initialization semiconductor layer 131d, the operation control semiconductor layer 131e, the emission control semiconductor layer 131f, and the bypass semiconductor layer 131g. On the first gate insulating layer 141, first gate wires 121, 122, 123, 125a, 125b, 125c, 125d, 125e, 125f, 125g, and 128, including a scan line 121 including a switching gate electrode 125b and a compensation gate electrode 125c, a previous scan line 122 including a initialization gate electrode 125d, an emission control line 123 including an operation control gate electrode 125e and an emission control gate electrode 125f, and a bypass line 128 including a driving gate electrode (or first storage electrode) 125a and a bypass gate electrode 125g, are formed.

A second gate insulating layer 142 is formed on the first gate wires 121, 122, 123, 125a, 125b, 125c, 125d, 125e, 125f, 125g, and 128 and the first gate insulating layer 141. The first gate insulating layer 141 and the second gate insulating layer 142 may be formed of silicon nitride (SiNx), silicon oxide (SiO$_2$), or the like.

A second gate wire 126 is formed on the second gate insulating layer 142. The second gate wire 126 includes the second storage electrode 126 overlapping with the first storage electrode 125a.

An interlayer insulating layer 160 is formed on the second gate insulating layer 142 and the second storage electrode 126. The interlayer insulating layer 160 may be formed by using a ceramic-based material such as silicon nitride (SiN$_x$) or silicon oxide (SiO$_2$).

Data wires 171, 172, 174, 176b, 176d, 177f, and 178, including a data line 171 including a switching source electrode 176b, a driving voltage line 172, a connecting member 174, an initialization source electrode 176d, an emission control drain electrode 177f, and a dummy member 178, are formed on the interlayer insulating layer 160.

The switching source electrode 176b is coupled with the switching source region 132b through the contact hole 62 formed in the first gate insulating layer 141, the second gate insulating layer 142, and the interlayer insulating layer 160, the driving voltage line 172 is coupled with the second storage electrode 126 through the contact hole 69 formed in the interlayer insulating layer 160, one end of the connecting member 174 is coupled with the driving gate electrode 125a through the contact hole 61 formed in the second gate insulating layer 142 and the interlayer insulating layer 160, and the other end of the connecting member 174 is coupled with the compensation drain electrode 177c through the contact hole 63 formed in the first gate insulating layer 141, the second gate insulating layer 142 and the interlayer insulating layer 160. In addition, the initialization source electrode 176d is coupled with the initialization source region 132d of the initialization semiconductor layer 131d through the contact hole 64 formed in the first gate insulating layer 141, the second gate insulating layer 142, and the interlayer insulating layer 160, and the emission control drain electrode 177f is coupled with the emission control drain region 133f through the contact hole 66 formed in the first gate insulating layer 141, the second gate insulating layer 142, and the interlayer insulating layer 160.

A plurality of dummy contact holes 40 is formed in the first gate insulating layer 141, the second gate insulating layer 142, and the interlayer insulating layer 160, and the dummy contact holes 40 include a plurality of first dummy contact holes 41 and a plurality of second dummy contact holes 42. A first dummy contact hole 41 includes a first sub dummy contact hole 411 and a second sub dummy contact hole 412. The first sub dummy contact hole 411 and the second sub dummy contact hole 412 are formed in the interlayer insulating layer 160, and the second dummy contact hole 42 passes through each of the first gate insulating layer 141, the second gate insulating layer 142, and the interlayer insulating layer 160.

The first dummy contact hole 41 is formed between the data wire and the second gate wire, the first sub dummy contact hole 411 is formed between the driving voltage line 172 and the second storage electrode 126, and the second sub dummy contact hole 412 is formed between the dummy member 178 and the second storage electrode 126. The second dummy contact hole 42 is formed at a position where each of the semiconductor layer and the gate wire and the data wire are not formed.

Figure 8:
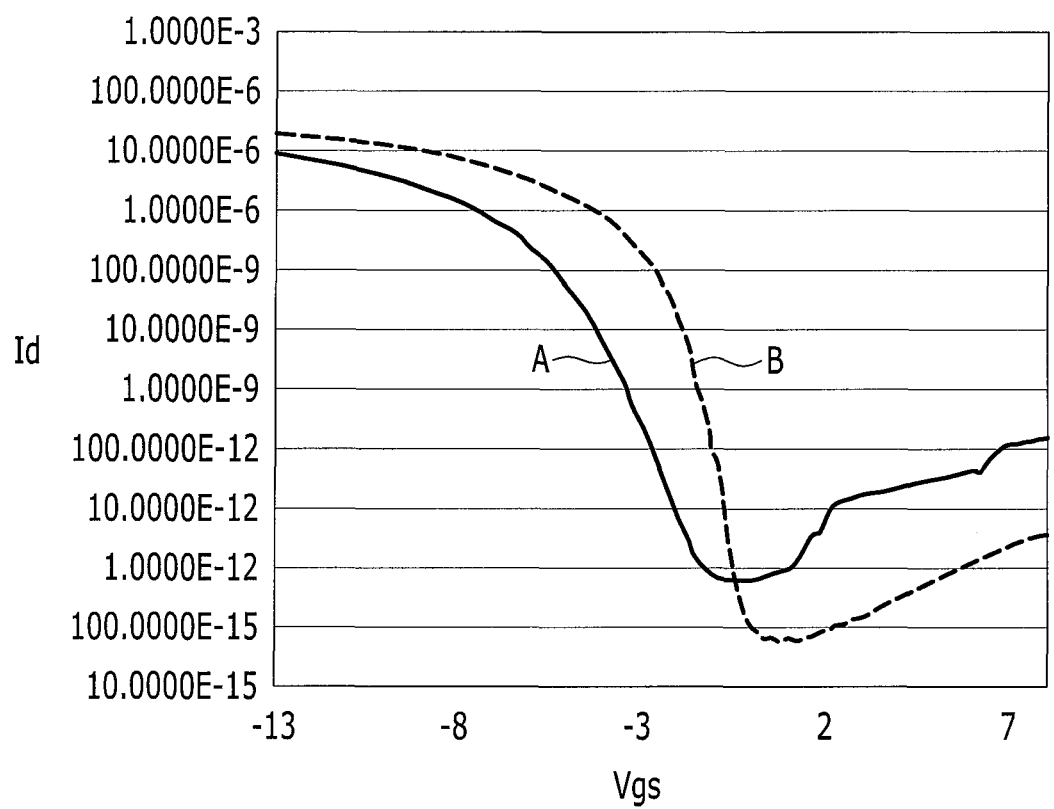
FIG. 8 is a graph illustrating a driving current curve of an organic light emitting diode display according to an example embodiment of the present invention and a driving current curve of an organic light emitting diode display according to the related art.

FIG. 8 is a graph illustrating a driving current curve of an organic light emitting diode display according to an example embodiment of the present invention and a driving current curve of an organic light emitting diode display according to the related art.

In FIG. 8, an x-axis represents a driving gate voltage Vgs applied to a driving gate electrode of the driving thin film transistor of the organic light emitting diode display, a y axis represents a driving current Id flowing in the organic light emitting diode of the organic light emitting diode display, A represents a driving current curve of an organic light emitting diode display with a plurality of dummy contact holes according to the present example embodiment, and B represents a driving current curve of an organic light emitting diode display according to the related art.

As illustrated in FIG. 8, since an inclined angle of the driving current curve of the organic light emitting diode display according to the example embodiment is smaller than an inclined angle of the driving current curve of the organic light emitting diode display according to the related art, a driving range of the driving gate voltage Vgs of the driving thin film transistor of the organic light emitting diode display according to the example embodiment is larger than a driving range of the driving gate voltage Vgs of the driving thin film transistor of the organic light emitting diode display according to the related art, and as a result, light emitted from the organic light emitting diode may be controlled to have richer grays by varying the magnitude of the driving gate voltage Vgs transferred to the driving thin film transistor.

As such, since the plurality of dummy contact holes 40 is formed in the display area P1, the stress applied to the driving thin film transistor may be changed by increasing the density of the contact holes. Accordingly, the driving range of the driving thin film transistor of the display area is increased to express the rich grays.

Further, in the case of forming the plurality of dummy contact holes 40, the stress applied to the driving thin film transistor may be changed by injecting ions and the like by using plasma or chemicals.

Accordingly, the driving range of the driving thin film transistor of the display area is increased to express the rich grays.

The first sub dummy contact hole 411 may be filled with the same material as the material of the driving voltage line 172, the second sub dummy contact hole 412 may be filled with the same material as the material of the dummy member 178, and the third dummy contact hole 42 may be filled with the same material as the material of the passivation layer 180. Particularly, the dummy member 178 is separately formed to cover the second sub dummy contact hole 412, and the dummy member 178 may reduce (e.g., prevent) an impurity from flowing into the second storage electrode 126 through the second sub dummy contact hole 412 from the outside.

Hereinabove, an example embodiment of the present invention for a position of the dummy contact member is illustrated, but the position of the dummy contact member is not necessarily limited thereto, and the dummy contact member may be formed at various positions.

A passivation layer 180 covering the data wires 171, 172, 174, 176b, 176d, 177f, and 178 is formed on the interlayer insulating layer 160, and a pixel electrode 191 and an initialization voltage line 124 are formed on the passivation layer 180. The pixel electrode 191 is coupled with the emission control drain electrode 177f through a contact hole 81 formed in the passivation layer 180, and the initialization voltage line 124 is coupled with the initialization source electrode 176d through a contact hole 82 formed in the passivation layer 180.

A partition wall 350 is formed on the edge of the pixel electrode 191 and the passivation layer 180, and the partition wall 350 has a partition wall opening 351 exposing the pixel electrode 191. The partition wall 350 may be made of a resin such as polyacrylates resin and polyimides resin, a silica-based inorganic material, or the like.

An organic emission layer 370 is formed on the pixel electrode 191 exposed by the partition wall opening 351, and a common electrode 270 is formed on the organic emission layer 370. As such, an organic light emitting diode 70 including the pixel electrode 191, the organic emission layer 370, and the common electrode 270 is formed.

Here, the pixel electrode 191 is an anode which is a hole injection electrode, and the common electrode 270 is a cathode which is an electron injection electrode. However, the example embodiments according to the present invention are not necessarily limited thereto, and according to a driving method of the organic light emitting diode display according to embodiments of the present invention, the pixel electrode 191 may be the cathode, and the common electrode 270 may be the anode. The hole and the electron are injected into the organic emission layer 370 from the pixel electrode 191 and the common electrode 270, respectively, and an exciton generated by coupling the injected hole and electron falls down from an excited state to a ground state to emit light.

The organic emission layer 370 may be made of a low-molecular organic material or a high-molecular organic material such as poly 3,4-ethylenedioxythiophene (PEDOT). Further, the organic emission layer 370 may be formed as a multilayer including an emission layer, and one or more of a hole injection layer (HIL), a hole transporting layer (HTL), an electron transporting layer (ETL), and an electron injection layer (EIL). In the case where the organic emission layer 370 includes all the layers, the hole injection layer (HIL) is on a pixel electrode which is an anode, and the hole transporting layer (HTL), the emission layer, the electron transporting layer (ETL), the electron injection layer (EIL) are sequentially laminated thereon.

The organic emission layer 370 may include a red organic emission layer emitting red light, a green organic emission layer emitting green light, and a blue organic emission layer emitting blue light. The red organic emission layer, the green organic emission layer, and the blue organic emission layer may be formed in a red pixel, a green pixel, and a blue pixel, respectively, thereby implementing a color image.

Further, the organic emission layer 370 may implement the color image by laminating each of the red organic emission layer, the green organic emission layer, and the blue organic emission layer together in the red pixel, the green pixel, and the blue pixel, and forming a red color filter, a green color filter, and a blue color filter for each pixel. As another example, white organic emission layers emitting white light are formed in each of the red pixel, the green pixel, and the blue pixel, and a red color filter, a green color filter, and a blue color filter are formed for each pixel, thereby implementing the color image. In the case of implementing the color image by using the white organic emission layer and the color filters, a deposition mask for depositing the red organic emission layer, the green organic emission layer, and the blue organic emission layer on respective pixels, that is, the red pixel, the green pixel, and the blue pixel, does not need to be used.

The white organic emission layer described in another example may be formed by one organic emission layer, and may include a configuration in which a plurality of organic emission layers is laminated so as to emit white light. For example, the white organic emission layer may include a configuration which may emit white light by combining at least one yellow organic emission layer and at least one blue organic emission layer, a configuration which may emit white light by combining at least one cyan organic emission layer and at least one red organic emission layer, a configuration which may emit white light by combining at least one magenta organic emission layer and at least one green organic emission layer, and the like.

An encapsulation member for protecting the organic light emitting diode 70 may be formed on the common electrode 270, and the encapsulation member may be coupled to (e.g., encapsulated on) the substrate 110 by a sealant, and may be made of various materials such as glass, quartz, ceramic, plastic, and metal. A thin film encapsulation layer may be formed by depositing an inorganic layer and an organic layer on the common electrode 270 without using the sealant.

A peripheral circuit formed at the peripheral part P2 of the organic light emitting diode display according to an example embodiment of the present invention will be described below in detail.

Figure 9:
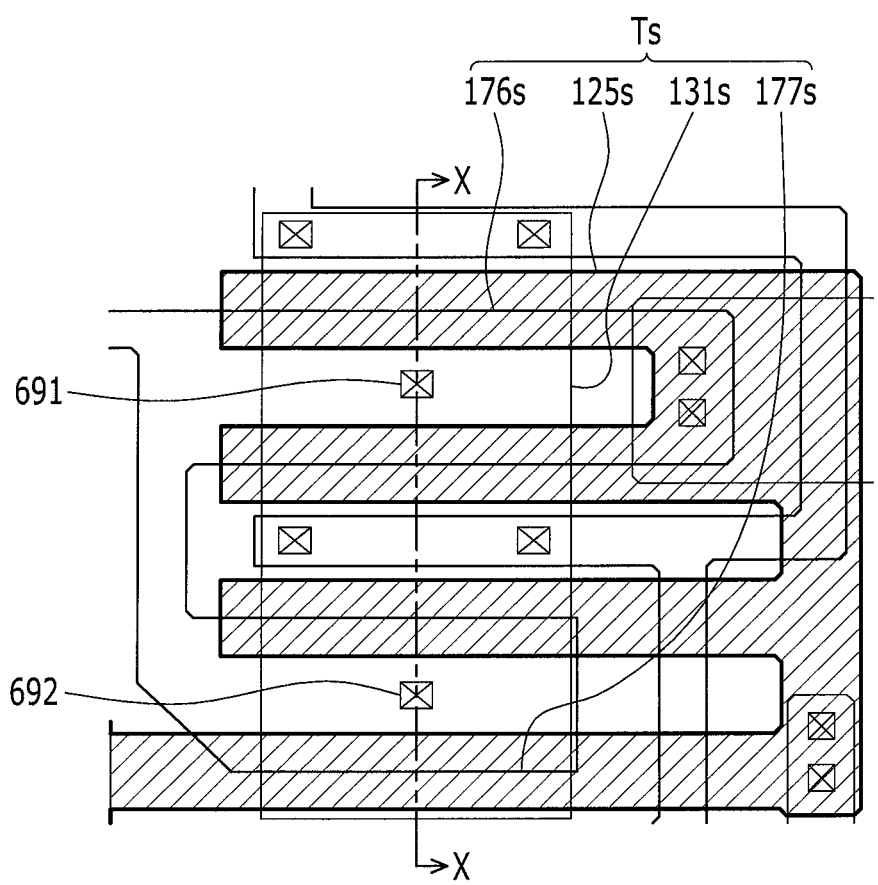
FIG. 9 is a diagram schematically illustrating a peripheral thin film transistor on a peripheral part of an organic light emitting diode display according to an example embodiment of the present invention.
Figure 10:
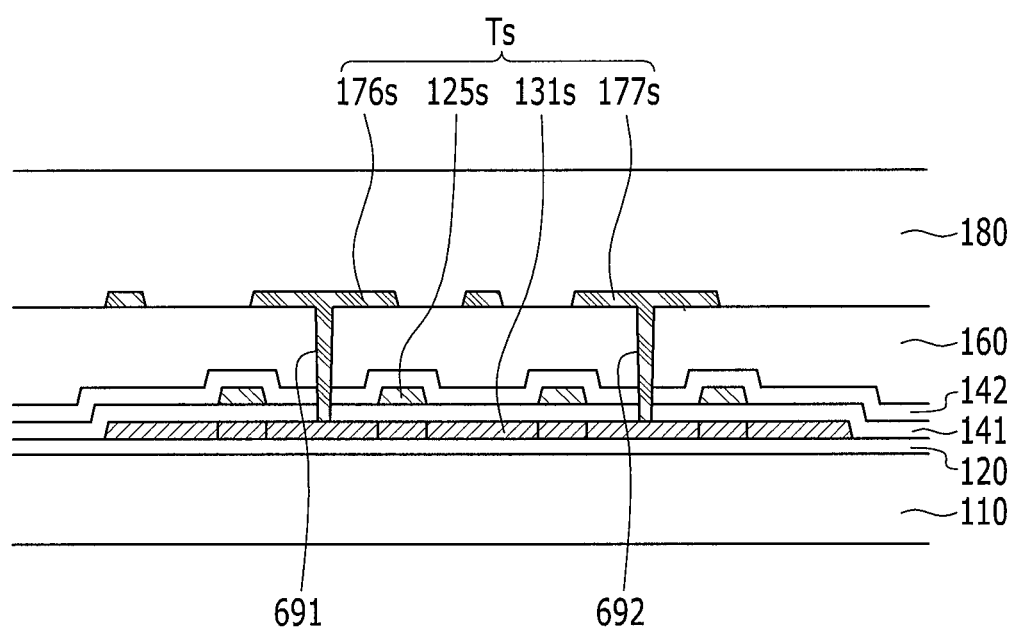
FIG. 10 is a cross-sectional view of FIG. 9 taken along the line X-X.

FIG. 9 is a diagram schematically illustrating a peripheral transistor on a peripheral part of an organic light emitting diode display according to an example embodiment of the present invention, and FIG. 10 is a cross-sectional view of FIG. 9 taken along line X-X.

As illustrated in FIGS. 9 and 10, a plurality of peripheral transistors Ts is formed at a peripheral circuit 2 formed at the peripheral part P2 of the organic light emitting diode display according to the present example embodiment. The peripheral transistor Ts is used as a switching element switching the peripheral circuit 2, such as a driving driver and a buffer, positioned at the peripheral part P2.

The peripheral transistor Ts includes a peripheral semiconductor layer 131$s$, a peripheral gate electrode 125$s$, a peripheral source electrode 176$s$, and a peripheral drain electrode 177$s$. The peripheral source electrode 176$s$ and the peripheral drain electrode 177$s$ face each other based on the peripheral gate electrode 125$s$ on a plane.

A buffer layer 120 is formed even on the substrate 110 of the peripheral part P2, and the peripheral semiconductor layer 131$s$ is formed on the buffer layer 120. A first gate insulating layer 141 is formed on the peripheral semiconductor layer 131$s$, the peripheral gate electrode 125$s$ is formed at a position overlapping with the peripheral semiconductor layer 131$s$ on the first gate insulating layer 141, and the second gate insulating layer 142 covering the peripheral gate electrode 125$s$ is formed on the first gate insulating layer 141. As such, the peripheral transistor Ts may perform a rapid switching operation because only the first gate insulating layer 141 is formed between the peripheral gate electrode 125$s$ and the peripheral semiconductor layer 131$s$.

In addition, the interlayer insulating layer 160 is formed on the second gate insulating layer 142, and the peripheral source electrode 176$s$ and the peripheral drain electrode 177$s$ are formed on the interlayer insulating layer 160. Each of the peripheral source electrode 176$s$ and the peripheral drain electrode 177$s$ is coupled with each of the peripheral semiconductor layers 131$s$ through contact holes 691 and 692, respectively, formed in the first gate insulating layer 141, the second gate insulating layer 142, and the interlayer insulating layer 160.

In this case, the number of peripheral contact holes 691 and 692 coupling the peripheral semiconductor layer 131$s$ with the peripheral source electrode 176$s$ and the peripheral drain electrode 177$s$ may be decreased (e.g., minimized) to 2 to 4. As such, the number of peripheral contact holes formed in one peripheral transistor Ts may be four or less, and as a result, the stress of the peripheral transistor is just minimally changed to increase (e.g., improve) charge mobility of the peripheral transistor of the peripheral part.

The passivation layer 180 covering the peripheral source electrode 176$s$ and the peripheral drain electrode 177$s$ is formed on the interlayer insulating layer 160.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims, and equivalents thereof.

DESCRIPTION OF SYMBOLS

110: Substrate
121: Scan line
122: Previous scan line
123: Emission control line
124: Initialization voltage line
128: Bypass control line
125$a$: Driving gate electrode
125$b$: Switching gate electrode
131$a$: Driving semiconductor layer
132$b$: Switching semiconductor layer
141: First gate insulating layer
142: Second gate insulating layer
171: Data line
172: Driving voltage line
174: Connecting member

What is claimed is:

1. An organic light emitting diode display comprising:
    a substrate comprising a display area configured to display an image and a peripheral area surrounding the display area;
    a semiconductor layer at the display area on the substrate;
    a first gate insulating layer covering the semiconductor layer;
    a first gate wire on the first gate insulating layer;
    a second gate insulating layer covering the first gate wire;
    a second gate wire on the second gate insulating layer;
    an interlayer insulating layer covering the second gate wire and having a contact hole, and a plurality of first dummy contact holes at the display area;
    a data wire on the interlayer insulating layer;
    a passivation layer covering the data wire; and
    an organic light emitting diode on the passivation layer and coupled to the data wire,
    wherein the data wire is coupled with the second gate wire through the contact hole in the interlayer insulating layer.

2. The organic light emitting diode display of claim 1, wherein each of the first dummy contact holes is between the data wire and the second gate wire.

3. The organic light emitting diode display of claim 2, wherein:
    the first gate wire comprises a scan line configured to transfer a scan signal; and
    the data wire comprises a data line and a driving voltage line configured to transfer a data signal and a driving voltage, respectively, and a dummy member to which a separate signal is not transferred.

4. The organic light emitting diode display of claim 3, wherein:
    each of the first dummy contact holes comprises a first sub dummy contact hole and a second sub dummy contact hole; and the first sub dummy contact hole is between the driving voltage line and the second gate wire, and the second sub dummy contact hole is between the dummy member and the second gate wire.

5. The organic light emitting diode display of claim 4, wherein the first dummy contact hole is filled with a same material as that of the data wire.

6. The organic light emitting diode display of claim 3, further comprising:
   a plurality of second dummy contact holes passing through the interlayer insulating layer, the second gate insulating layer, and the first gate insulating layer.

7. The organic light emitting diode display of claim 6, wherein each of the second dummy contact holes is filled with a same material as that of the passivation layer.

8. The organic light emitting diode display of claim 3, wherein:
   the semiconductor layer comprises a switching semiconductor layer of a switching thin film transistor coupled with the scan line and the data line, and a driving semiconductor layer of a driving thin film transistor coupled with the switching thin film transistor; and
   the driving semiconductor layer is curved on a plane.

9. The organic light emitting diode display of claim 8, further comprising:
   a storage capacitor comprising a first storage electrode on the first gate insulating layer and overlapping the driving semiconductor layer, and
   a second storage electrode on the second gate insulating layer covering the first storage electrode and overlapping the first storage electrode,
   wherein the second storage electrode is a driving gate electrode of the driving thin film transistor, and
   the second gate wire comprises the second storage electrode.

10. The organic light emitting diode display of claim 1, further comprising:
   a plurality of peripheral thin film transistors at the peripheral area,
   wherein the plurality of peripheral thin film transistors comprises:
      a peripheral semiconductor layer on the substrate;
      a peripheral gate electrode on the first gate insulating layer covering the peripheral semiconductor layer; and
      a peripheral source electrode and a peripheral drain electrode on the second gate insulating layer and the interlayer insulating layer sequentially covering the peripheral gate electrode,
   wherein the peripheral source electrode and the peripheral drain electrode are coupled with the peripheral semiconductor layers through peripheral contact holes in the first gate insulating layer, the second gate insulating layer, and the interlayer insulating layer, and
   a number of the peripheral contact holes in one peripheral thin film transistor of the plurality of peripheral thin film transistors is 2 to 4.

* * * * *